United States Patent [19]

Mueller

[11] Patent Number: 4,760,033

[45] Date of Patent: Jul. 26, 1988

[54] METHOD FOR THE MANUFACTURE OF COMPLEMENTARY MOS FIELD EFFECT TRANSISTORS IN VLSI TECHNOLOGY

[75] Inventor: Wolfgang Mueller, Putzbrunn, Fed. Rep. of Germany

[73] Assignee: Siemens Aktiengesellschaft, Berlin and Munich, Fed. Rep. of Germany

[21] Appl. No.: 21,795

[22] Filed: Mar. 4, 1987

[30] Foreign Application Priority Data

Apr. 8, 1986 [DE] Fed. Rep. of Germany ....... 3611797

[51] Int. Cl.$^4$ .......................................... H01L 21/265
[52] U.S. Cl. ........................................ 437/34; 437/30; 437/57; 437/228
[58] Field of Search .................. 437/34, 27, 30, 41, 437/43, 44, 52, 57, 58, 56, 228, 235, 238, 241; 357/59 G, 42; 151/643, 653, 657

[56] References Cited

U.S. PATENT DOCUMENTS

| 4,139,402 | 2/1979 | Steinmaier et al. | 437/34 |
| 4,434,543 | 3/1984 | Shuabe et al. | 437/34 |
| 4,525,920 | 7/1985 | Jacobs et al. | 437/57 |
| 4,590,663 | 5/1986 | Haken | 437/34 |
| 4,642,878 | 2/1987 | Maeda | 437/34 |
| 4,701,423 | 10/1987 | Szluk et al. | 437/44 |
| 4,703,551 | 11/1987 | Szluk et al. | 437/44 |

FOREIGN PATENT DOCUMENTS 0169600 1/1986 European Pat. Off. ............. 437/34

OTHER PUBLICATIONS

Ogura et al., IEEE Transactions on Electron Devices, Aug. 1980, pp. 1359 to 1367.
Ogura et al., IEDM, 1982, pp. 718 to 721.
Walczyk et al., IEDM 83 (1983), pp. 59 to 62.
Ohta et al., IEEE Transactions on Electron Devices, Aug. 1980, pp. 1352 to 1358.

*Primary Examiner*—Brian E. Hearn
*Assistant Examiner*—Kevin McAndrews
*Attorney, Agent, or Firm*—Hill, Van Santen, Steadman & Simpson

[57] ABSTRACT

The manufacture of n-channel and p-channel transistors in a CMOS process which involves employing gate spacer oxide layers for of reducing the under-diffusion of the implanted source-drain regions under the gate areas. The spacer oxide widths for the n-channel and the p-channel transistor are set differently so that both transistor types can be optimized independently of one another and without an additional expenditure for more masking steps. The method is employed for the manufacture of large scale integrated circuits for fast switching speeds.

10 Claims, 2 Drawing Sheets

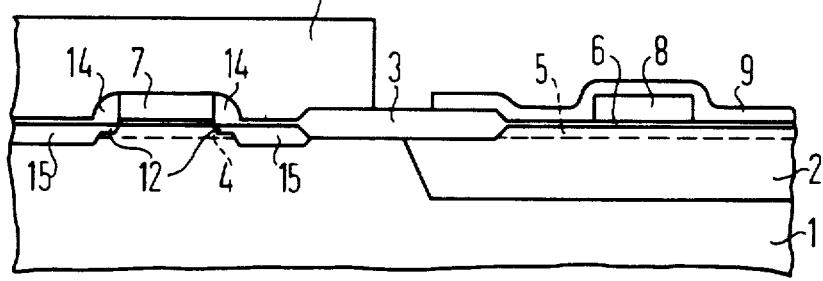
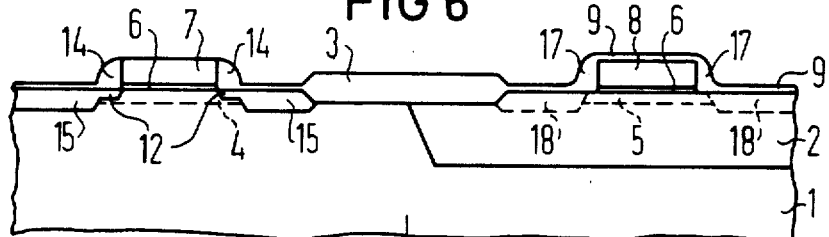
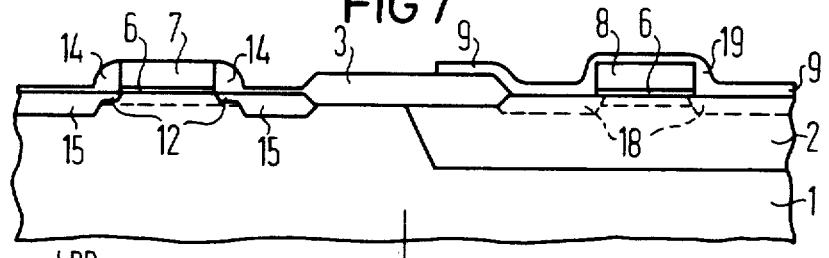
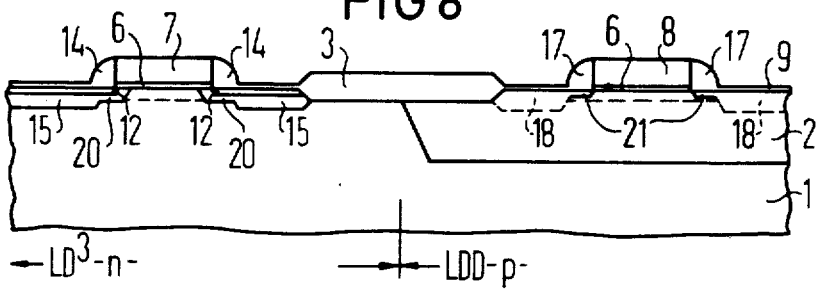

METHOD FOR THE MANUFACTURE OF COMPLEMENTARY MOS FIELD EFFECT TRANSISTORS IN VLSI TECHNOLOGY

BACKGROUND OF THE INVENTION

1. Field of the Invention

The present invention is directed to a method for manufacturing complementary MOS field effect transistors in very large scale integration (VLSI) technology wherein gate electrodes are provided with a spacer oxide in order to reduce the underdiffusion of the implanted source/drain regions under the gate area.

2. Description of the Prior Art

In the manufacture of very large scale integrated circuits having structural dimensions on the order of one micron, parasitic effects such as source/drain overlap capacitances, voltage punch-through effects from drain to source, and the so-called "hot electron" effects induced by the high electrical field strengths at the drain increase significantly at a supply voltage of about five volts. The first named effect reduces the switching speed. The punch-through leads to an inadequate inhibiting capability of the transistor. The hot electron effect causes a long term instability of characteristics.

For suppressing these effects, MOS field effect transistors having a suitable pre-arranged profile of the source/drain diffusion have been proposed. By what is referred to as a "source/drain pull-back" described in European Patent Application No. 0 123 182 as well as in a report by K. Ohta et al in IEEE ED-27 (1980), pages 1352–1358, the source/drain diffusion can be pulled back from the gate edge in order to obtain a reduction of the overlap capacitances.

Transistors having a lightly doped connection region to the channel, and referred to as lightly doped drain (LDD) transistors are described in a report by S. Ogura et al in IEEE ED-27 (1980), pages 1359–1367. Transistors referred to as lightly doped drain double diffused transistors are described in a report by S. Ogura et al in IEDM (1982), pages 718–721. Transistors referred to as buried channel lightly doped drain transistors are described in a report by S. Megura et al in IDEM (1983), pages 59–62. The aforementioned transistors lead to improved punch-through behavior and to a noticeable reduction of the hot electron effects.

A method of the type initially described is disclosed, for example, in the aforementioned European Patent Application No. 0 123 182. In this method, there is an attempt made to prevent under-diffusion of the MOS transistor gate due to a pull-back from the gate edge by providing a spacer oxide which is formed by re-oxidation of the polysilicon gate before the source/drain implantation.

SUMMARY OF THE INVENTION

The present invention provides for the implantation of a one micron process sequence for the manufacture of optimized CMOS transistors wherein largely decoupled n-channel and p-channel transistors can be made without an additional expenditure for masking steps and without the aforementioned effects of overlapping capacitances, punch-through, and hot electrons.

In accordance with the present invention, there is provided a method composed in general of the following steps:

(a) providing a silicon substrate doped with a dopant of a particular conductivity type, the substrate having n-wells or p-wells formed therein, with field oxide regions separating the active transistor regions, and channel implantation regions for n-channel and p-channel transistors, and gate regions for the transistors being already defined;

(b) depositing a first $SiO_2$ layer on the substrate to a thickness corresponding to the spacer oxide width of the gate of the p-channel transistor to be later generated;

(c) depositing a silicon nitride layer on the substrate to form a double layer of $SiO_2$ and silicon nitride;

(d) structuring the double layer so that the p-channel regions remain covered by the double layer;

(e) thermally oxidizing the resulting substrate;

(f) implanting ions for forming an n-channel transistor;

(g) depositing a second $SiO_2$ layer and anisotropically etching the same such that oxide regions remain at the side walls of the n-channel gate electrodes;

(h) carrying out source/drain ion implantation for generating the n-channel transistors;

(i) applying a photo-resist mask onto the n-channel regions not covered by the double layer and removing the remaining second $SiO_2$ layer in the p-channel region by isotropic over-etching;

(j) removing the silicon nitride layer;

(k) anisotropically re-etching the first $SiO_2$ layer such that oxide regions remain at the side walls of the gate electrodes in the p-channel region and a residual oxide of less than 50 nm remains on the active transistor regions;

(l) carrying out source/drain ion implantation for generating p-channel transistors; and (m) forming metallic electrodes extending to the active transistor regions.

Several variations can be made to the sequence of steps outlined above. For example, method step (c) can by omitted and an undoped polysilicon layer having a thickness of 0.2 to 0.4 microns can be applied instead of the second $SiO_2$ layer referred to in step (g).

Another alternative is to omit step (k) and adjusting the thickness of the first $SiO_2$ layer, the implantation energy of the source/drain implantation of method step (l) and the following high temperature processing such that the source/drain doping extends just under the gate electrode.

One of the advantages of the present invention is that spacer oxide widths can be independently provided for n-channel and p-channel transistors and thus the two transistor types can be independently optimized. In view of this flexibility, several alternatives for n-channel and p-channel transistors are possible:

(1) lightly doped drain n-channel transistor and a p-channel transistor with source/drain pull-back;

(2) lightly doped drain n-channel transistor and buried channel lightly doped drain p-channel transistor; and (3) lightly doped drain double implanted n-channel transistor and lightly doped drain p-channel transistor.

BRIEF DESCRIPTION OF THE DRAWINGS

One alternative process sequence is set forth in greater detail in FIGS. 1 to 6 which represent greatly enlarged views illustrating the sequence of operations;

FIG. 7 is a greatly enlarged sectional view of another alternative form of the present invention; and FIG. 8 is a cross-sectional view of a still further modified form of the invention.

DESCRIPTION OF THE PREFERRED EMBODIMENTS

Figure 1:
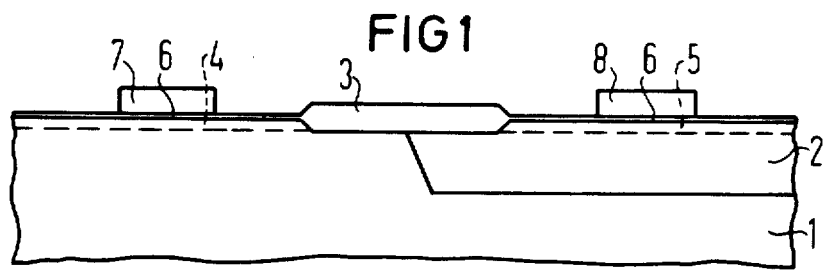

The FIGS. 1-6 illustrate sections of semiconductors after carrying out the method steps essential to the invention, identical parts being provided with the same reference numerals in all figures. The particular embodiment illustrated relates to an n-well CMOS process although the same process sequence can be used with appropriate changes for a p-type process.

As seen in FIG. 1, well regions and active regions are defined by means of a conventional CMOS process. The gate oxide of the transistors is grown, the channel implantation of the n-channel and p-channel transistors is introduced, and the gate electrodes composed, for example, of polysilicon or polycide are deposited and structured. FIG. 1 illustrates the cross-section through an n-channel and p-channel transistor at this point. The p-doped silicone substrate is referred to at reference numeral 1 and the n-well for the p-channel transistor is referred to at reference numeral 2. A field oxide 3 separates the active transistor regions. Channel implantations 4 and 5 are provided in accordance with the usual procedure, and a gate oxide 6 is provided in keeping with standard operating technique. Structured gate electrodes 7 and 8 are also formed on the surface of the substrate as illustrated.

Figure 2:
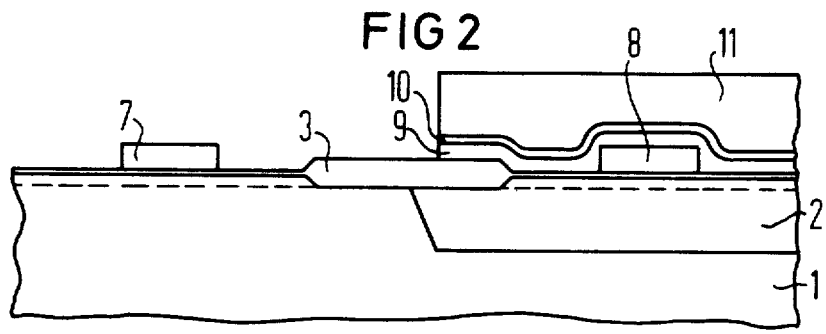

Referring to FIG. 2, a first SiO$_2$ layer 9 is produced by chemical vapor deposition to a thickness in excess of 100 nm, and typically in the range of 100 to 200 nm. A chemically vapor deposited silicon nitride layer 10 is then deposited to a thickness of from 50 to 100 nm, and preferably at about 50 nm. The layer thickness of the first SiO$_2$ layer 9 is thus matched to the spacer oxide width of the gate of the p-channel transistor to be generated subsequently. The silicon nitride layer 10 serves as a protective layer for the anisotropic re-etching step for generating an oxide spacer 14 of the n-channel transistors. In a subsequent photolithographic step, the later produced p-channel regions (well 2) are covered with a first photo-resist mask 11 and the double layer 9, 10 composed of SiO$_2$ and silicon nitride is then structured. The arrangement shown in FIG. 2 is thus produced.

Figure 3:
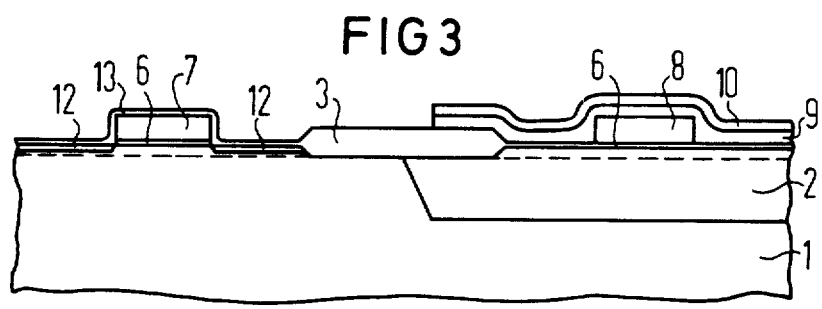

As seen in FIG. 3, the photo-resist mask 11 is removed and a thermal oxidation is carried out to grow an oxide layer 13 having a thickness of 30 to 50 nm. The following step involves implantation for the n-channel transistor (LDD) with phosphorus ions with a dosage of $5 \times 10^{12}$ through $1 \times 10^{13}$ cm$^{-2}$ and a dosage level of 80 keV. An implanted zone 12 is thus produced.

Figure 4:
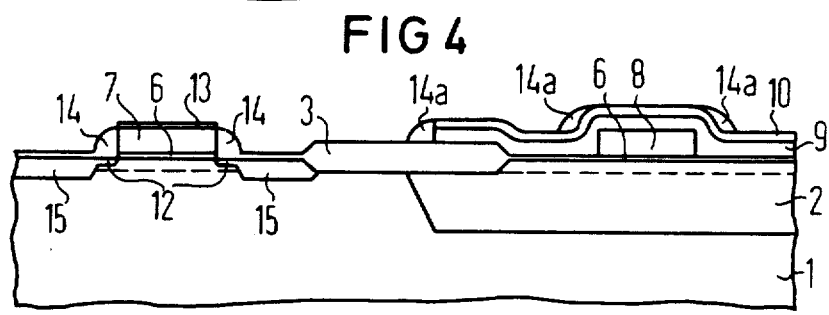

Referring next to FIG. 4, after the deposition of a second SiO$_2$ layer 14 by a chemical vapor deposition process to a thickness of 150 to 300 nm and preferably about 200 nm, a spacer oxide 14 is formed at the sidewalls of the n-channel gate electrode 7. The spacer oxide 14 is formed by means of anisotropic re-etching of the chemically vapor deposited SiO$_2$ layer 14 which was deposited in conformity to the configuration of the gates. Residues of the oxide layer appear as layer portions 14a at the steps of the p-channel gate electrode 8 and over the field oxide in the region of the p-channel transistors. Instead of using a second SiO$_2$ layer 14 for spacer formation, an undoped polysilicon layer can also be deposited. In this case, the silicon nitride layer 10 shown in FIG. 2 is not required.

The source/drain regions 15 of the n-channel transistors are now formed by arsenic ion implantation at a dosage of $3 \times 10^{15}$ through $8 \times 10^{15}$ cm$^{-2}$ and at an energy level of about 80 keV. When an SiO$_2$ layer 14 is used for spacer formation, a scatter oxide of a thickness of 30 to 50 nm (not shown) must also be grown. Finally, there is a thermal activation of the n+ diffusion for setting the desired resistance. The structure shown in FIG. 4 results.

In the next sequence of operations shown in FIG. 5, the n-channel regions are covered by means of a second photoresist mask 16 after which there is a isotropic over-etching for the removal of the oxide residue 14a at the steps in the p-channel region. The silicon nitride layer 10 is then removed, leaving the structure as shown in FIG. 5.

FIG. 6 illustrates a spacer oxide 17 which is defined at the side walls of the gate electrode 8 in the p-channel region by anisotropic re-etching of the first SiO$_2$ layer 9. The etching is controlled such that a residual oxide 9 in a thickness of about 50 nm still remains on the active transistor regions. The source/drain regions 18 of the p-channel transistors are formed by boron ion implantations with an energy level of $5 \times 10^{15}$ cm$^{-2}$, and a dosage of 25 keV. After removal of the photo-resist mask 16 the structure shown in FIG. 6 results, illustrating the regions for the n-channel transistor and for the p-channel transistors. Further process steps such as intermediate oxide deposition and flowing, contact hole formation and metallization are carried out in accordance with conventional processings and are not shown in FIG. 6.

A further alternative form of the invention is shown in FIG. 7. An LDD n-channel transistor and p-channel transistor with source/drain pull-back is produced from the process sequence described in connection with FIGS. 1-6. The re-etching step provided for in FIG. 6 is eliminated. In this alternative, there is provided a conforming spacer 19 for the source/drain implantation 18 before the p-channel transistors. The thickness of the first SiO$_2$ layer 9, the implantation zones 18 and the following high temperature processing are selected such that the source/drain doping 18 extends barely under the gate electrode 8 as shown in FIG. 7.

In a further alternative shown in FIG. 8, an LDD n-channel transistor and LDD p-channel transistor are produced from the process sequence indicated in FIGS. 1-6. Prior to the deposition of the first SiO$_2$ layer 9, however, a surface-wide boron implantation of about 10$^{12}$ cm$^{-2}$ is deposited at 25-50 keV. This boron ion implantation functions as a boron "pocket" implantation 20 for the n-channel transistor. (In this connection, see the report of S. Ogura et al in IEDM (1982), pages 718-721, which is incorporated herein by reference). The boron ion implantation also serves to produce an implant zone 21 in the LDD p-channel transistor.

It will be evident that various modifications can be made to the described embodiments without departing from the scope of the present invention.

I claim as my invention:

1. A method for the manufacture of a complementary MOS field effect transistor which comprises:
   (a) providing a silicon substrate doped with a dopant of a first conductivity type, said substrate having n-wells or p-wells formed therein, field oxide regions separating the active transistor regions, channel implantation regions for n-channel and p-channel transistors and a gate region for the transistors already defined;

(b) depositing a first $SiO_2$ layer on said substrate to a thickness corresponding to the spacer oxide width of the gate of the p-channel transistor to be later generated;

(c) depositing a silicon nitride layer on said substrate to form a double layer of $SiO_2$ and silicon nitride;

(d) structuring said double layer so that p-channel regions remain covered by said double layer;

(e) thermally oxidizing the resulting substrate;

(f) implanting ions for forming an n-channel transistor;

(g) depositing a second $SiO_2$ layer and anisotropically etching the same such that oxide regions remain at the side walls of the n-channel gate electrodes;

(h) carrying out source/drain ion implantations for generating the n-channel transistors;

(i) applying a photo-resist mask onto the n-channel regions not covered by said double layer and removing the remaining second $SiO_2$ layer in the p-channel region by isotropic over-etching, (j) removing said silicon nitride layer;

(k) anisotropically re-etching said first $SiO_2$ layer such that oxide regions remain at the side walls of said gate electrodes in the p-channel region and a residual oxide of less than 50 nm remains on the active transistor regions;

(l) carrying out source/drain ion implantation for generating p-channel transistors; and (m) forming metallic electrodes extending to said active transistor regions.

2. A method according to claim 1 in which said first $SiO_2$ layer of step (b) is produced by chemical vapor deposition to a thickness in excess of 100 nm.

3. A method according to claim 1 wherein said silicon nitride layer of step (c) is produced by chemical vapor deposition to a thickness of from 50 to 100 nm.

4. A method according to claim 1 wherein said second $SiO_2$ layer of step (g) is produced by chemical vapor deposition to a thickness of from 150 to 300 nm.

5. A method according to claim 1 wherein the thermal oxidizing of step (e) is carried out to produce an $SiO_2$ layer of 30 to 50 nm thickness.

6. A method according to claim 1 wherein the implanting step (f) is carried out with phosphorus ions at a dosage of $5 \times 10^{12}$ to $1 \times 10^{13}$ cm$^{-2}$ at an energy level of about 80 keV.

7. A method according to claim 1 wherein the implanting step (h) is carried out with arsenic ions at a dosage of $3 \times 10^{15}$ to $8 \times 10^{15}$ cm$^{-2}$ and an energy level of about 80 keV.

8. A method according to claim 7 which includes the step of applying a scatter oxide at a thickness in the range of 30 to 50 nm before said implanting step (h).

9. A method according to claim 1 wherein the implantation of step (l) is carried out with boron ions at a dosage of about $5 \times 10^{15}$ cm$^{-2}$ and an energy level of about 25 keV.

10. A method according to claim 1 wherein the depositing of step (b) is preceeded by a surface wide boron ion implantation at a dosage of $10^{12}$ cm$^{-2}$ and an energy level of 25 to 50 keV.

* * * * *